United States Patent
Muellner

(10) Patent No.: US 6,437,633 B2
(45) Date of Patent: Aug. 20, 2002

(54) SWITCHING ELEMENT, STAGE AND SYSTEM

(75) Inventor: Ernst Muellner, Munich (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/733,420

(22) Filed: Dec. 8, 2000

(51) Int. Cl.[7] .............................................. H03K 17/60
(52) U.S. Cl. ........................................ 327/478; 327/365
(58) Field of Search ................................. 327/365, 374, 327/379, 383, 384, 391, 401, 405, 432, 437, 451, 478–482, 463, 486, 488

(56) References Cited

U.S. PATENT DOCUMENTS

| | | | | |
|---|---|---|---|---|
| 3,936,813 A | * | 2/1976 | Tsang | 340/173 FF |
| 4,177,392 A | * | 12/1979 | Haferl | 327/378 |
| 5,347,210 A | * | 9/1994 | Nguyen | 323/315 |
| 5,578,956 A | * | 11/1996 | Rossi et al. | 327/309 |

FOREIGN PATENT DOCUMENTS

| | | |
|---|---|---|
| DE | 2 144 677 | 9/1972 |
| DE | 2 333 191 | 9/1974 |
| DE | 40 10 283 A1 | 10/1991 |
| EP | 0 148 395 | 7/1985 |

* cited by examiner

Primary Examiner—My-Trang Nuton
(74) Attorney, Agent, or Firm—Bell, Boyd & Lloyd LLC

(57) ABSTRACT

A switching element having two signal inputs and two signal outputs, in which switching element a first and second transistor are provided, the base terminals of which are connected to one another and are connected to a drive unit. The collector terminals of the first and second transistor form the two signal outputs and the emitter terminals of the first and second transistor form the two signal inputs to which a current source can be connected in each case. The switching element provides for implementation of a switching system with low power loss.

7 Claims, 2 Drawing Sheets

SWITCHING ELEMENT, STAGE AND SYSTEM

BACKGROUND OF THE INVENTION

1. Field of the Invention

The present invention relates to a switching element and a switching stage, each of which has two signal inputs and two signal outputs, and further relates to a switching system having a number of switching elements arranged in the form of a matrix.

2. Description of the Prior Art

In the past, various solutions for a switching network have been proposed. Such switching networks have a multiplicity of inputs and outputs, in which arrangement the data streams or message streams are switched through from one of the inputs to at least one fixed output. A message stream directed to one of the inputs of the switching network is, thus, forwarded in such a manner that it leaves it again at one of the outputs. In such known switching network arrangements, the switching network units themselves are constructed of a multiplicity of discrete components; for example, transistors and resistors.

Such switching networks are implemented as switching network matrices; i.e., the switching points implemented by the switching network can be described by the elements of a matrix and, thus, have a matrix-like structure. In the implementation of switching network matrices for high-bit-rate data signals, the data signals to be switched are loaded by the very high line capacities caused by data signal lines or switching elements within the switching network arrangement. As such, the degradation of the data signals increases considerably at high data transmission rates which leads to a limitation of the size of the switching network matrix which can be implemented.

To implement larger switching network matrices, switching arrangements are known in which an n×m switching network matrix is formed by cascading mn: 1 multiplexer units. Dividing the complex switching matrix to be implemented into a number of smaller sub-matrices in this manner makes it possible to implement larger switching network matrices. However, the use of a number of weaker line drivers for the multiplicity of small sub-matrices considerably increases the degradation of the data signals, i.e. the power loss, and the complexity of the drive to the switching arrangement.

An object of the present invention, therefore, is to improve the circuit implementation of switching elements or switching network systems.

SUMMARY OF THE INVENTION

The switching element of the present invention thus includes first and second transistors, the base terminals of which are connected to one another and are connected to a drive unit. Furthermore, the emitter terminals of the first and second transistor form the two signal inputs to which a current source can be connected in each case. The collector terminals of the first and second transistor form the two signal outputs. According to the teachings of the present invention, the switching element includes a differential common-base transistor pair which makes possible to provide a high-impedance drive to the base of the first and second transistor. Due to the connection between the two base terminals, the base charge necessary for high-frequency operation can flow between these two terminals; i.e., the high-frequency base currents, which are comparatively high with respect to the direct-current case, do not need to be provided by the drive unit so that the power loss of the drive unit can be kept low. The switching function of the switching element is implemented by the drive unit, in which the application of a constant base potential to the base terminals of both the first and second transistors turns on one of the two transistors which, in turn, passes through the entire data signal stream as well as the auxiliary currents generated by the current sources. By providing current sources, especially constant-current sources, connected to the emitter terminals in accordance with the present invention, the transistor not turned on by the drive unit additionally becomes conductive and, thus, conducts the auxiliary current generated by the respective constant-current source. As a result, the resultant signal excursion on the input signal lines is reduced and the influence of capacitive loads at the input signal lines is distinctly reduced.

According to a further embodiment of the present invention, an output stage, or switching stage, having two signal inputs and two signal outputs is provided which has a first and second transistor, the base terminals of which are connected to one another and are connected to a drive unit or a reference potential. In this arrangement, the emitter terminals of the first and second transistor form the two signal inputs to which, in each case, one current source can be connected. The collector terminals of the first and second transistor form the two signal outputs to which a reference potential is, in each case, connected via a resistor. The output stage is implemented by a transistor pair operated in differential common base, to the collector terminals of which a reference potential is connected via a resistor. The output stage thus operates as a current/voltage converter. In this arrangement, the reference potential required for turning on can be provided at low power, due to the coupling of the base terminals of the first and second transistor according to the present invention, since the required base charge can flow between the two base terminals of the transistor pair.

Also, according to the present invention, the two signal inputs of the output stage are additionally connected to two outputs of an input circuit constructed as a differential amplifier, as a result of which a point-to-point transmission link can be implemented with low power loss. The data transmitted in the form of voltage levels is converted by the input circuit constructed as a differential amplifier into signal streams which are alternately present at the two signal inputs. The data is thus transmitted from the input unit to the output unit in the form of signal streams, in which case the output unit can be easily arranged remotely from the input unit.

Furthermore, the advantage of the switching system of the present invention, having a number of switching elements arranged in the form of a matrix, can be seen in the fact that in each row of the matrix. the two signal inputs of one of the switching elements arranged in a row, are connected to a first and second input signal line to which a current source is connected in each case. In each column of the matrix, the two signal outputs of one of the switching elements arranged in a column are additionally connected to a first and second output signal line. Moreover, a further current source is connected in each case to the first and second output signal line, and the first and second output signal line are connected to the two signal inputs of one output stage. Such a switching system or switching network matrix can be implemented with extremely low power loss since, with the aid of the current sources connected to the first and second input signal lines of a row of the switching matrix, the first and second transistor of the switching element arranged in the respective row of the matrix, at which a switching potential is present with the aid of the drive unit, in each case turns on. The differential current generated by the input unit and representing the data is then alternately forwarded to the output stage via the first or second transistor arranged in the switched switching element, additionally to the currents generated by the current sources. The excursion on the first and second input signal line is adjusted by the presence of a constant current, generated by the current sources, at the first and second input signal line in accordance with the teachings of the present invention. This considerably reduces the influence of the capacitive loads. This also makes it possible to implement larger switching networks without increasing the complexity of the circuit implementation or, respectively, of the drive circuits.

According to a further embodiment of the switching system of the present invention, a further current source is, in each case, connected to the first and second output signal line. This makes it possible in a particularly advantageous manner to design the transmission of the signal currents via the first and second output signal lines, in combination with an output stage, to have a low power loss.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
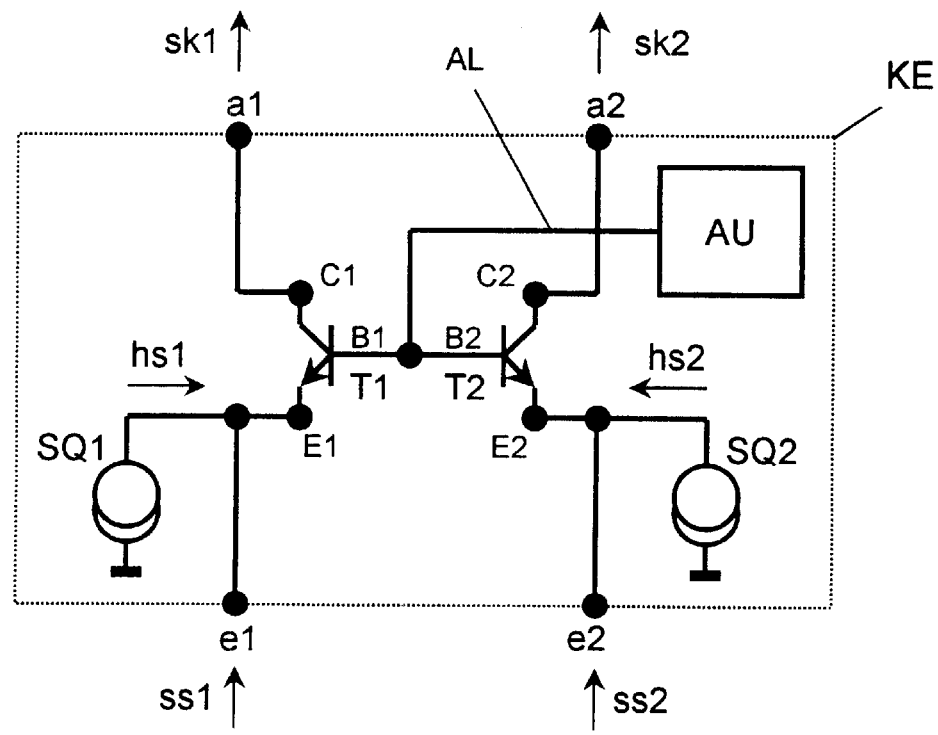
FIG. 1 shows the basic configuration of a switching element according to the teachings of the present invention.

FIG. 1 shows the basic configuration of the switching element KE in accordance with the present invention. The switching element KE includes, for example, a first transistor T1, a second transistor T2 and a drive unit AU. The first transistor T1 has a first emitter terminal E1, a first collector terminal C1 and a first base terminal B1. Analogously therewith, the second transistor T2 has a second emitter terminal E2, a second collector terminal C2 and second base terminal B2. The first base terminal B1 and the second base terminal B2 are connected to one another and are connected to the drive unit AU via a drive line AL. Furthermore, the switching element KE has a first and a second input e1, e2 and a first and second output a1, a2. The first input e1 of the switching element KE is connected to the first emitter terminal E1 of the first transistor T1 and the second input e2 of the switching element KE is connected to the second emitter input E2 of the second transistor T2. Furthermore, the first output a1 is connected to the first collector terminal C1 of the first transistor T1 and the second output a2 is connected to the second collector input C2 of the second transistor T2. In addition, a current source SQ1, SQ2 can be connected, in each case, to the emitter terminals; i.e., to the first emitter terminal E1 and to the second emitter terminal E2. FIG. 1 shows a first current source SQ1 and a second current source SQ2. The first current source SQ1 is connected to the first emitter terminal E1 of the first transistor T1 and the second current source SQ2 is connected to the second emitter terminal E2 of the second transistor T2.

To switch through a signal current ss1, ss2 being present either at the first input e1 of the switching unit KE or at the second input e2 of the switching unit KE, the transistors T1, T2 are turned on with the aid of the drive unit AU or, respectively, the control potential or switching potential generated by the drive unit AU. If a switching potential generated by the drive unit AU is present at the first base terminal B1 or, respectively, at the second base terminal B2, either the first signal current ss1 or the second signal current ss2 are, in each case, switched through to the first output a1 or, respectively, to the second output a2 by the first transistor T1 or the second transistor T2. That is, a first or second signal current ss1, ss2 in each case flows via one of the two transistors T1, T2 from the first input e1 to the first output a1 or from the second input e2 to the second output a2. In addition, the auxiliary current hs1 generated by the first current source SQ1 or, respectively, the auxiliary current hs2 generated by the second current source SQ2 is continuously switched through to the first output a1 or, respectively, to the second output a2 via the first transistor T1 or, respectively, via the second transistor T2. As a result, the transistors T1, T2 are continuously conductive with the aid of the auxiliary currents hs1, hs2 generated by the first and second current sources SQ1, SQ2 and, thus, represent a type of basic current for the switching element KE. It will be assumed here that the required switching potential is present at the first and second base terminals B1, B2. These basic currents or auxiliary currents hs1, hs2 are superimposed on the first and second signal current or data signal current ss1, ss2. Thus, a current flows, for example, at the first output a1 which almost corresponds to the first auxiliary signal current hs1 the first signal current ss1 (called first switching current sk1 in FIG. 1) whereas only the second auxiliary signal current hs2 flows at the second output a2 (called second switching current sk2 in FIG. 1).

Furthermore, the base charges can be exchanged due to the connection of the first base terminal B1 to the second base terminal B2. That is, the base charges can flow between the first and second transistors T1, T2 and do not need to be additionally provided by the drive circuit AU.

Figure 2:
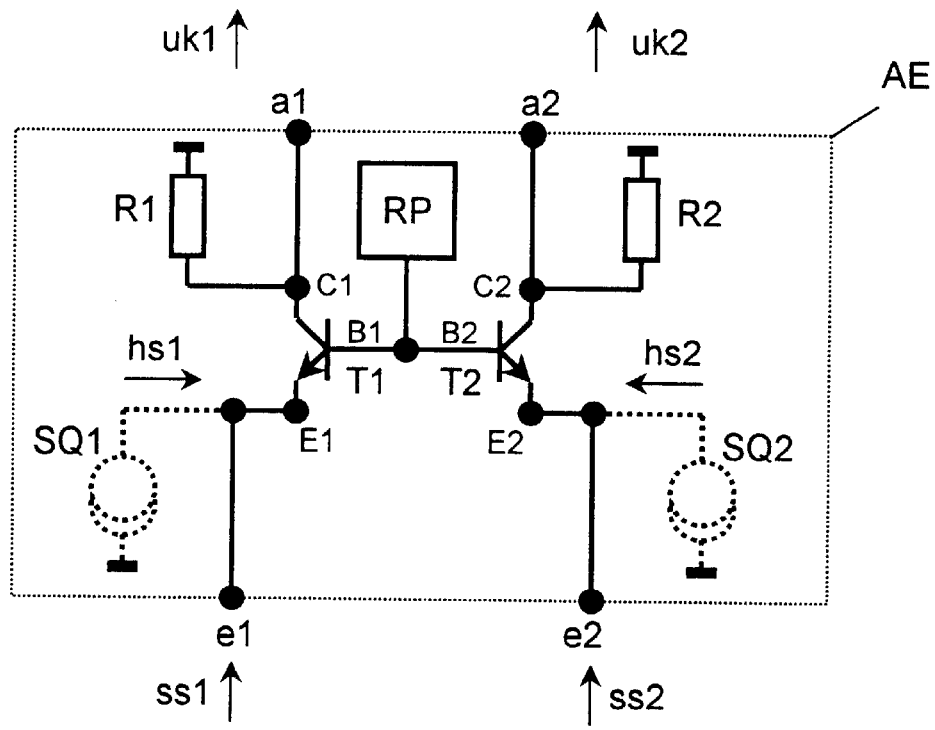
FIG. 2 shows the basic configuration of an output stage according to the present invention.

FIG. 2 shows the basic configuration of the output stage AE, or switching stage, according to the present invention. The output stage AE has a drive unit or reference potential unit RP, a first transistor T1, a second transistor T2, a first resistor R1 and a second resistor R2. In addition, a first current source SQ1 and a second current source SQ2 also can be provided. Analogously to FIG. 1, the first transistor T1 also has a first emitter terminal E1, a first base terminal B1 and a first collector terminal C1. The second transistor T2 also has a second base terminal B2, a second emitter terminal E2 and a second collector terminal C2. The first base terminal B1 on the first transistor T1 is connected to the second base terminal B2 of the second transistor T2 and is, in each case, connected to the reference potential unit RP. Again, as in FIG. 1, the first emitter terminal E1 of the first transistor T1 is connected to the first input e1 of the output stage AE and the second emitter terminal E2 of the second transistor T2 is connected to the second output e2 of the output stage AE.

Additionally, a first current source SQ1 can be connected to the first emitter terminal E1 of the first transistor T1 and a second current source SQ2 can be connected to the second emitter terminal E2 of the second transistor T2-indicated by a first and second current source SQ1, SQ2 drawn dashed in FIG. 2. Furthermore, the first output a1 of the output stage AE and the first resistor R1, the further terminal of which is connected to a reference potential (usually ground potential), are connected to the first collector terminal C1 of the first transistor T1. Analogously therewith, the second collector terminal C2 of the output stage AE is connected to the second output a2 of the output stage AE and to the second resistor R2, the further terminal of the second resistor R2 again being connected to a reference potential.

The first or second signal current ss1, ss2 present at the first or second input e1, e2 in each case flows, analogously to FIG. 1, via the first or second transistor T1, T2 to the collector terminal C1, C2 of the respective transistor T1, T2. This will be so, provided the reference potential generated by the reference potential unit RP is available or, respectively, present at the first and second base terminal B1, B2, respectively. The first or second signal current ss1, ss2, possibly a first or second auxiliary current hs1, hs2 generated by the first and second current source SQ1, SQ2, then flows away to ground via the first or second resistor R1, R2. As a result, a first voltage uk1 is dropped across the first resistor R1 or a second voltage uk2 is dropped across the second resistor R2. The output stage AE according to the present invention converts the first and second signal currents ss1, ss2, fed in at the first and second input e1, e2, into proportional voltages; i.e., a first and second voltage uk1, uk2. The output stage AE, thus, advantageously implements a current/voltage converter unit.

Figure 3:
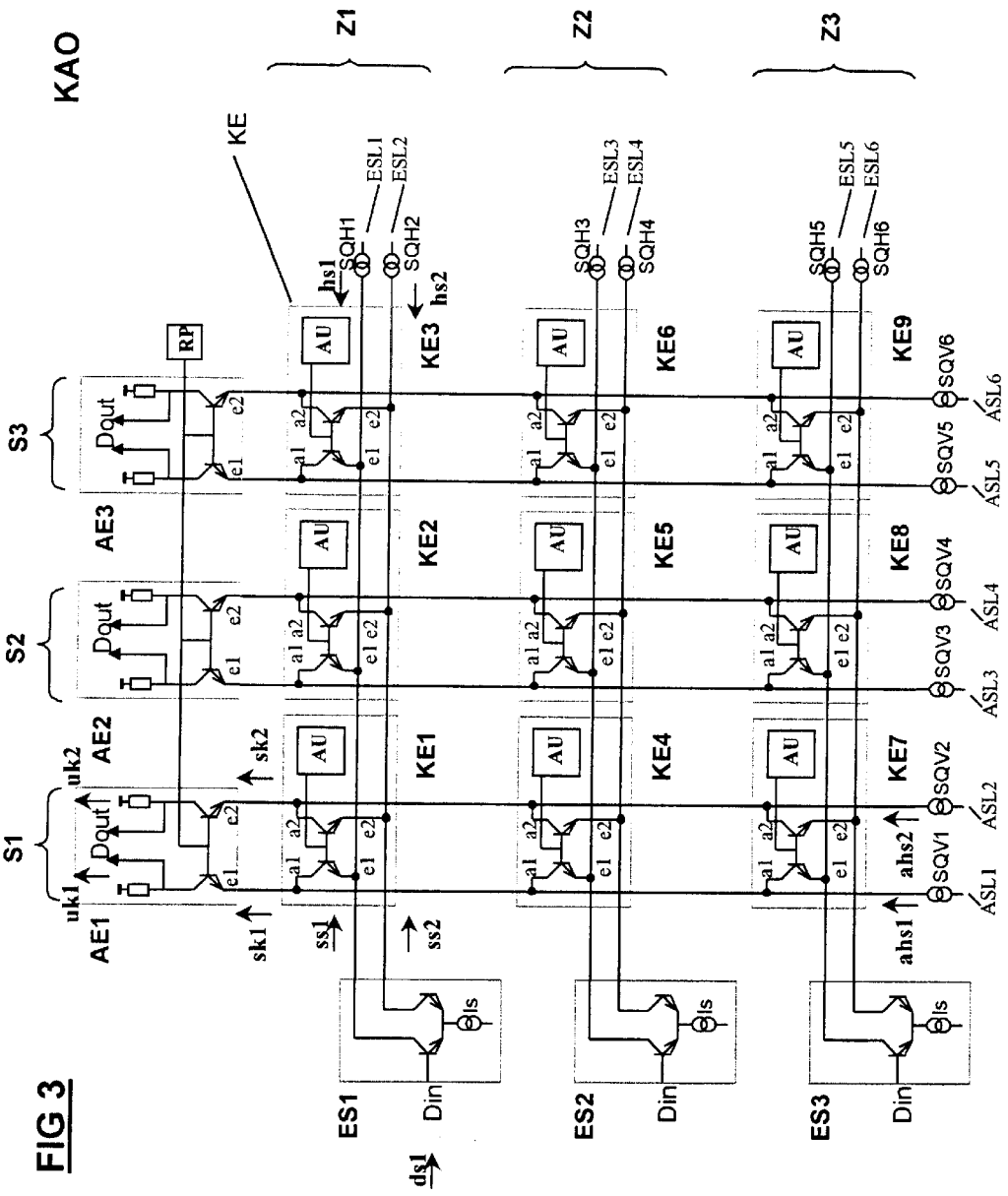
FIG. 3 shows the basic configuration of a switching system of the present invention and the output stages connected thereto, wherein the input circuits are constructed as differential amplifiers.

FIG. 3 shows the switching system KAO according to the present invention, including a number of output stages AE1 to AE3, a number of input circuits ES1 to ES3 and a number of switching elements KE1 to KE9. The switching system KAO represented in FIG. 3 implements, for example, a 3×3 switching arrangement or switching network matrix KAO; i.e., the switching matrix consists of a first, second and third row Z1, Z2, Z3 and of a first, second and third column S1, S2, S3. Furthermore, three switching elements KE are, in each case, arranged on the first, second and third row Z1, Z2, Z3 and in each case three switching elements KE are arranged on the first, second and third column S1, S2, S3. In particular, the first switching unit KE1, a second switching unit KE2 and a third switching unit KE3 are provided in the first row Z1, and a fourth switching unit KE4, a fifth switching unit KE5, and a sixth switching unit KE6 are provided in the second row Z2. Finally, a seventh switching unit KE7, an eighth switching unit KE8 and a ninth switching unit KE9 are provided in the third row Z3. The matrix-shaped structure of the switching system KAO and the aforementioned allocation of the switching elements KE1 to KE9 to the three rows Z1, Z2, Z3 result in the following allocation of the switching elements KE1 to KE9 to the respective columns S1, S2, S3. In this arrangement, in particular, the first column S1 has the first switching element KE1, the fourth switching element KE4 and the seventh switching element KE7; the second column S2 has the second switching element KE2, the fifth switching element KE5 and the eighth switching element KE8; and the third column S3 has the third switching element KE3, the sixth switching element KE6 and the ninth switching element KE9. Analogously to the matrix-shaped arrangement of the switching elements KE, the first switching element KE1, the second switching elements KE2 and the third switching element KE3 is or, respectively, are connected via a first and a second input signal line ESL1, ESL2 to a first input circuit ES1. Furthermore, the switching elements arranged in the second row Z2 (i.e., the fourth switching element KE4 and fifth switching element KE5 and the sixth switching element KE6) are connected to a second input circuit ES2 via a third and fourth input signal line ESL3, ESL4. In addition, the switching elements arranged in the third row Z3 of the switching network arrangement KAO (i.e., the seventh switching element KE7, the eighth switching element KEA8 and the ninth switching element KE9) are connected to a third input circuit ES3 via a fifth and sixth input signal line ESL5, ESL6.

In this arrangement, the first signal input e1 of the respective switching elements KE1 to KE9 is in each case connected to the one input signal line and the second signal input e2 of the respective switching elements KE1 to KE9 and is connected to the other input signal line of a row Z1, Z2, Z3. In the case of the first row Z1, for example, the first input signal line ESL1 is respectively connected to the first signal input e1 of the first, second and third switching element KE1, KE2, KE3 and the second input signal line ESL2 is respectively connected to the second signal input e2 of the first, second and third switching element KE1, KE2, KE3. Analogously therewith, the remaining switching elements KE4 to KE6 are connected to the remaining input signal lines ESL4 to ESL6 of the second and third row Z2, Z3.

In the illustrative embodiment shown, the first, second and third input circuit ES1 to ES3 are, in each case, constructed as a differential amplifier circuit, for example, and therefore have two transistors and a current source $I_s$ connected to the emitter terminals of the two transistors. Furthermore, the two collector terminals of the transistors arranged in the respective input circuit form the two outputs of the respective input circuits ES1 to ES3 to which the input signal lines ESL1 to ESL6 are connected. Furthermore, one of the two base terminals of the two transistors of the respective input circuit ES1 to ES3 are, in each case, designed as data signal input $D_{in}$, wherein the other base terminal of the respective input circuit ES1 to ES3 is not used in each case; i.e., no potential is applied thereto.

Furthermore, the signal outputs a1, a2 of the switching elements KE1 to KE9 arranged in a column S1, S2, S3 are connected to the signal inputs e1, e2 of the respective output stage, or switching stage, AE1 to AE3 via output signal lines ASL1 to ASL6. In particular, the first signal output a1 of the first, fourth and seventh switching element KE1, KE4, KE7 arranged in the first column S1 is, in each case, connected via a first output signal line ASL1 to the first signal input e1 of a first output stage AE1 and the second signal output a2 of the first, fourth and seventh switching element KE1, KE4, KE7 arranged in the first column S1 is connected to the second signal input e2 of a first output stage AE1 via a second output signal line ASL2. Furthermore, the first signal output a1 of the second, fifth and eighth switching element KE2, KE5, KE8 arranged in the second column S2 is, in each case, connected via a third output signal line ASL3 to the first signal input e1 of a second output stage AE2 and the second signal output a2 of the second, fifth and eighth switching element KE2, KE5, KE8 arranged in the second column S2 is connected via a fourth output signal line ASL4 to the second signal input e2 of a second output stage AE2. In addition, the first signal output a1 of the third, sixth and ninth switching element KE3, KE6, KE9 arranged in the third column S3 is connected to the first signal input e1 of a third output stage AE3 via a fifth output signal line ASL5 and the second signal output a2 of the third, sixth and ninth switching element KE3, KE6, KE9 arranged in the third column S3 is connected via a sixth output signal line ASL6 to the second signal input e2 of a third output stage AE3.

According to the present invention, current sources, especially constant-current sources SQH1 to SQH6 and SQV1 to SQV6, by means of which a first and second auxiliary current hs1, hs2 per row or first and second auxiliary output current ahs1, ahs2 per column of the switching matrix is fed into the respective switching elements KE or, respectively, the output stages AE, are connected to the input signal lines ESL1 to ESL6 and to the output signal lines ASL1 to ASL6. FIG. 3 shows the first to sixth current sources SQH1 to SQH6 provided for feeding the horizontally arranged switching elements KE. The first, horizontally arranged current source SQH1 is connected to the first input signal line ESL1. The second, horizontally arranged current source SQH2 is connected to the second input signal line ESL2. The third, horizontally arranged current source SQH3 is connected to the third input signal line ESL3. The fourth, horizontally arranged current source SQH4 is connected to the fourth input signal line ESL4. The fifth, horizontally arranged current source SQH5 is connected to the fifth input signal line ESL5. The sixth, horizontally arranged current source SQH6 is connected to the sixth input signal line ESL6. In addition, FIG. 3 shows the first to sixth current sources SQV1 to SQV6, provided for feeding the vertically arranged switching elements KE. The first, vertically arranged current source SQV1 is connected to the first output signal line ASL1. The second, vertically arranged current source SQV2 is connected to the second output signal line ASL2. The third, vertically arranged current source SQV3 is connected to the third output signal line ASL3. The fourth, vertically arranged current source SQV4 is connected to the fourth output signal line ASL4. The fifth, vertically arranged current source SQV5 is connected to the fifth output signal line ASL5. The sixth, vertically arranged current source SQV6 is connected to the sixth output signal line ASL6. The first and second auxiliary currents hs1, hs2 per switching element KE generated by the first to sixth horizontally arranged current source SQH1 to SQH6, and the first and second auxiliary output currents ahs1, ahs2 generated by the first to sixth vertically arranged current source SQV1 to SQV6 usually have the same value.

In the text which follows, a switch-over cycle of the switching system KAO according to the present invention is described as an example of the operation of the switching system KAO for a connection via the first input circuit ES1, the first switching element KE1 and the first output stage AE1. The data signal ds1 present at the data signal input $D_{in}$ of the first input circuit ES1 is converted into an alternating sequence of signal currents ss1, ss2 with the aid of the first input circuit ES1 which is designed as a differential amplifier. In this arrangement, a first signal current ss1 flows at the first output a1 of the first input circuit ES1 and a second signal current ss2 flows at the first output a2 of the first input circuit ES1, as a function of the data signal ds1. The first signal current ss1 is directed via the first input signal line ESL1 to the first signal input e1 of the first switching element KE1 and the second signal current ss2 is directed via the second input signal line ESL2 to the second signal input e2 of the first switching element KE1. Furthermore, a first and second auxiliary signal current hs1, hs2, generated by the first and second horizontally arranged signal current source SQH1, SQH2 is present at the first and, respectively, second signal input e1, e2 of the first switching element KE1. In addition, the switching potential required for turning on the first and second transistor T1, T2 of the first switching element KE1 is applied, with the aid of the drive unit AU, to the interconnected base terminals B1, B2 of the first and second transistor T1, T2. The first and second auxiliary current hs1, hs2 provide the required line excursion for alternately switching through the first and second signal current ss1, ss2 via the first switching element KE1 which considerably reduces the power loss in the respective switching elements KE. Thus, for example, when a first signal current ss1 is present, a current which approximately corresponds to the sum of the first signal current ss1 and the first auxiliary current hs1 flows through the first transistor T1 of the first switching element KE1. Due to the second transistor T2 of the first switching element KE1, however, only the second auxiliary current hs2 flows since no second signal current ss2 is present at the second signal input e2 of the first switching element KE1.

Furthermore, the first signal current ss1 flows, together with the first auxiliary current hs1 (called first switching current sk1 in the further text) while the first output signal line ASL1 to the first input e1 of the first output stage AE1 and the second auxiliary current (called second switching current sk1 in the further text) flows via the second output signal line ASL2 to the second input e2 of the first output stage AE1 in which the first switching current sk2 flows away to ground via the first transistor T1 of the first output stage AE1 and via the first resistor R1 and the second switching current sk2 flows away to ground via the second transistor T2 of the first output stage AE1 and via the second resistor R2. For this purpose, the required reference potential is connected to the first and second base terminal B1, B2 of the first and second transistor T1, T2 of the first output stage AE1 via the reference potential unit RP. In addition, the first and second auxiliary output current ahs1, ahs2 generated by the first and second vertically arranged current sources SQV1, SQV2 are directed to the first and, respectively, second signal input e1, e2 of the first output stage AE1. These inputs, in each case, turn on the transistor T1, T2, connected to the first or second signal input e1, e2, of the first output unit AE1. This first auxiliary output current ahs1 has superimposed on it the first switching current sk1 which is coupled into the first output signal line ASL1 via the first switching element KE1. These currents produce across the first resistor R1 of the first output stage AE1 a voltage drop which corresponds to the first voltage uk1 present at the first signal output at of the first output stage AE1. Analogously therewith, the second auxiliary output current ahs2 has superimposed on it the second switching current sk2 which flows from the second signal output a2 of the first switching element KE1 and both flow into the first output stage AE1 via the second signal input e2. The second auxiliary output current ahs2 and the second switching current sk2 flow away to ground via the second transistor T2 and the second resistor R2. As a result, a voltage drop is generated across the second resistor R2 which is represented by a second voltage uk2 present at the second signal output a2 of the first output stage AE1. The original data signal ds1 is reconstructed again from the ratio of the first and second voltage uk1, uk2.

Due to the application, according to the present invention of a switching potential in the individual switching elements KE1 to KE9 by the respective drive unit AU, each input circuit ES1 to ES3 can be connected to each output stage AE1 to AE3 or, respectively, a connection switched through between the desired input circuit/output stage pair. Due to the addition of horizontally and vertically arranged current sources SQH1 to SQH6, SQV1 to SQV6, the signal excursion is distinctly reduced both on the input signal lines ESL1 to ESL6 and on the output signal lines ASL1 to ASL6 which reduces the influence of the line capacity. As a result, the power loss of the entire switching arrangement KAO can be considerably reduced even in the case of an implementation of larger switching arrangements KAO.

Although the present invention has been described with reference to specific embodiments, those of skill in the art will recognize that changes may be made thereto without departing from the spirit and scope of the invention as set forth in the hereafter appended claims.

I claim as my invention:

1. A switching element, comprising:
    a first signal input;
    a second signal input;
    a first signal output;
    a second signal output;
    a first transistor having a first base terminal, a first emitter terminal and a first collector terminal;
    a second transistor having a second base terminal, a second emitter terminal and a second collector terminal; and
    a drive unit, wherein the first and second base terminals are connected to each other and are further connected to the drive unit, the first and second emitter terminals are respectively connected to the first and second signal inputs for further connection to, respectively, first and second current sources, and the first and second collector terminals are respectively connected to the first and second signal outputs, wherein the drive unit generates a switching voltage for turning on both the first and second transistors.

2. A switching stage, comprising:
    a first signal input;
    a second signal input;
    a first signal output;
    a second signal output;
    a first transistor having a first base terminal, a first emitter terminal and a first collector terminal;
    a second transistor having a second base terminal, a second emitter terminal and a second collector terminal; and
    one of a drive unit and a reference potential, wherein the first and second base terminals are connected to each other and are further connected to the one of the drive unit and the reference potential, the first and second emitter terminals are respectively connected to the first and second signal inputs for further connection to, respectively, first and second current sources, and the first and second collector terminals are respectively connected to the first and second signal outputs to which first and second voltages are respectively connected via first and second resistors, wherein the one of the drive unit and the reference potential generates a switching voltage for turning on the first and second transistors.

3. A switching stage as claimed in claim 2, wherein the first and second signal inputs are respectively connected to first and second outputs of a differential amplifier input circuit.

4. A switching system, comprising:
    a plurality of switching elements arranged in rows and columns to form a matrix, each of the plurality of switching elements including first and second signal inputs, first and second signal outputs, a first transistor having a first base terminal and an emitter terminal and a collector terminal, a second transistor having a second base terminal and a second emitter terminal and a second collector terminal, and a drive unit, wherein the first and second base terminals are connected to one another and are further connected to the drive unit, the first and second emitter terminals are respectively connected to the first and second signal inputs, and the first and second collector terminals are respectively connected to the first and second signal outputs;
    a first input signal line for each row of the matrix, wherein each first signal input of every switching element in the row is connected to the first input signal line to which a first current source is further connected;
    a second input signal line for each row of the matrix, wherein each second signal input of every switching element in the row is connected to the second input signal line to which a second current source is further connected;
    a first output signal line for each column of the matrix, wherein each signal output of every switching element in the column is connected to the first output signal line; and
    a second output signal line for each column of the matrix, wherein each second signal output of every switching element in the column is connected to the second output signal line.

5. A switching system as claimed in claim 4, wherein a third current source is connected to the first output signal line and a fourth current source is connected to the second output signal line.

6. A switching system as claimed in claim 4, wherein in each row of the matrix, the first and second input signal lines are respectively connected to first and second outputs of a differential amplifier input circuit.

7. A switching system as claimed in claim 6, further comprising:
    a plurality of switching stages wherein each one of the plurality of switching stages corresponds to one row of the matrix, each switching stage including first and second stage signal inputs, first and second stage signal outputs, a first stage transistor having a first base terminal and a first emitter terminal and a first collector terminal, a second stage transistor having a second base terminal and a second emitter terminal and a second collector terminal, and one of a second drive unit and a reference potential, wherein the first and second base terminals of the first and second stage transistors are connected to one another and are further connected to the one of the second drive unit and the reference potential, the first and second emitter terminals of the first and second stage transistors are respectively connected to the first and second stage signal inputs, the first and second collector terminals of the first and second stage transistors are respectively connected to the first and second stage signal outputs to which first and second voltages are respectively connected via first and second resistors, the first output signal line is connected to the first stage signal input, and the second output signal line is connected to the second stage signal input.

* * * * *